(12) United States Patent
Iizuka

(10) Patent No.: US 9,117,633 B2
(45) Date of Patent: Aug. 25, 2015

(54) PLASMA PROCESSING APPARATUS AND PROCESSING GAS SUPPLY STRUCTURE THEREOF

(75) Inventor: Hachishiro Iizuka, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 987 days.

(21) Appl. No.: 13/271,399

(22) Filed: Oct. 12, 2011

(65) Prior Publication Data

US 2012/0090783 A1    Apr. 19, 2012

Related U.S. Application Data

(60) Provisional application No. 61/410,029, filed on Nov. 4, 2010.

(30) Foreign Application Priority Data

Oct. 13, 2010   (JP) .................................. 2010-230679

(51) Int. Cl.
   *C23C 16/00*   (2006.01)
   *C23F 1/00*   (2006.01)
   *H01L 21/306*   (2006.01)
   *H01J 37/32*   (2006.01)

(52) U.S. Cl.
   CPC .......... *H01J 37/321* (2013.01); *H01J 37/3244* (2013.01)

(58) Field of Classification Search
   USPC ............. 156/345.48, 345.49, 345.33, 345.34; 118/723 I, 723 IR, 715; 315/111.51
   See application file for complete search history.

(56) References Cited

U.S. PATENT DOCUMENTS

| 6,033,585 | A  | * | 3/2000 | Wicker et al. ................... 216/68 |
| 6,209,480 | B1 | * | 4/2001 | Moslehi ...................... 118/723 I |
| 6,444,040 | B1 |   | 9/2002 | Herchen |
| 2004/0154747 | A1 | * | 8/2004 | Ni et al. ................... 156/345.48 |
| 2006/0137610 | A1 | * | 6/2006 | Yoshizaki et al. ......... 118/723 E |
| 2009/0130335 | A1 |   | 5/2009 | Okumura |
| 2010/0178775 | A1 |   | 7/2010 | Okesaku |

FOREIGN PATENT DOCUMENTS

| CN | 101258786 A | 9/2008 |
| CN | 101529563 A | 9/2009 |
| JP | 08-017748 A | 1/1996 |
| JP | 09-186140 A | 7/1997 |
| JP | 11-158662 A | 6/1999 |

(Continued)

*Primary Examiner* — Rakesh Dhingra
(74) *Attorney, Agent, or Firm* — Pearne & Gordon LLP

(57) ABSTRACT

There is provided a plasma processing apparatus for performing a process on a substrate by generating inductively coupled plasma. The plasma processing apparatus includes an upper lid, provided to cover a top opening of the processing chamber, having a dielectric window; multiple gas inlets provided at the upper lid; a high frequency coil positioned above the dielectric window at an outside of the processing chamber; and a gas supply device supported by the upper lid and provided under the dielectric window. Here, the gas supply device includes a single sheet of plate having through holes, multiple groove-shaped gas paths are formed between the plate and the dielectric window, end portions of the groove-shaped gas paths are opened to edges of the through holes and communicate with the gas inlets, and the gas supply device is configured to supply the processing gas into the processing chamber via the through holes.

13 Claims, 4 Drawing Sheets

(56) References Cited

FOREIGN PATENT DOCUMENTS

| JP | 2001-085413 A | 3/2001 |
| JP | 2005-209885 A | 8/2005 |
| JP | 3845154 A | 8/2006 |
| JP | 2008-108796 A | 5/2008 |

\* cited by examiner

PLASMA PROCESSING APPARATUS AND PROCESSING GAS SUPPLY STRUCTURE THEREOF

CROSS-REFERENCE TO RELATED APPLICATION

This application claims the benefit of Japanese Patent Application No. 2010-230679 filed on Oct. 13, 2010 and U.S. Provisional Application Ser. No. 61/410,029 filed on Nov. 4, 2010, the entire disclosures of which are incorporated herein by reference in their entirety.

FIELD OF THE INVENTION

The present disclosure relates to a plasma processing apparatus and a processing gas supply structure thereof.

BACKGROUND OF THE INVENTION

Conventionally, in a semiconductor device manufacturing field, there is known a plasma processing apparatus using inductively coupled plasma (ICP) as an apparatus for performing a process such as a film forming process or an etching process on a substrate such as a semiconductor wafer.

In a plasma processing apparatus having a high frequency coil provided above an upper portion of a processing chamber, as a processing gas supply structure of the plasma processing apparatus using ICP, a processing gas supply device of an annular hollow pipe is provided around a substrate, i.e., in a space between the high frequency coil and the substrate. Further, a processing gas is discharged into a space above the substrate from a multiple number of gas discharge openings formed at an inner periphery of the hollow pipe (for example, see Patent Document 1).

Meanwhile, in a plasma processing apparatus having a high frequency coil provided at a sidewall of a processing chamber, for example, a processing gas is discharged from an upper center of the processing chamber to a space above a substrate (for example, see Patent Document 2).

As the above-described processing gas supply structures, a nozzle type structure having holes or slits is used. In the plasma processing apparatus having the high frequency coil provided above the upper portion of the processing chamber, if there exists a large structure for introducing the gas to above the substrate, the substrate are blocked by the large structure, so that a non-uniform process on the substrate may be performed. Meanwhile, if a gas diffusion space is provided above the substrate and below the high frequency coil, a means to prevent an electric discharge in this space may be needed. For this reason, a region for discharging a gas is basically limited to a central portion and an outer peripheral portion of the substrate.

Patent Document 1: Japanese Patent Laid-open Publication No. 2001-085413

Patent Document 2: Japanese Patent No. 3845154

As described above, in the conventional plasma processing apparatus and the processing gas supply structure thereof, since the region for discharging a gas is limited, it may be difficult to improve uniformity of a process on a substrate surface by controlling a supply of the processing gas.

BRIEF SUMMARY OF THE INVENTION

In view of the above, the present disclosure provides a plasma processing apparatus and a processing gas supply structure thereof, capable of improving uniformity of a process on a substrate surface in comparison with a conventional apparatus.

In accordance with one aspect of the present disclosure, there is provided a plasma processing apparatus for performing a process on a substrate accommodated in a processing chamber by generating inductively coupled plasma in the processing chamber. The plasma processing apparatus includes an upper lid, provided to cover a top opening of the processing chamber, having a dielectric window; a multiple number of gas inlets provided at the upper lid, for supplying a processing gas into the processing chamber; a high frequency coil positioned above the dielectric window at an outside of the processing chamber; and a gas supply device supported by the upper lid and provided under the dielectric window. Here, the gas supply device may include a single sheet of plate having through holes. Further, a multiple number of groove-shaped gas paths may be formed between the plate and the dielectric window. Furthermore, end portions of the multiple number of groove-shaped gas paths may be opened to edges of the through holes and communicate with the gas inlets. Moreover, the gas supply device may be configured to supply the processing gas into the processing chamber via the through holes.

In accordance with another aspect of the present disclosure, there is provided a processing gas supply structure of a plasma processing apparatus including an upper lid provided to cover a top opening of the processing chamber and having a dielectric window, a multiple number of gas inlets provided at the upper lid and configured to supply a processing gas into the processing chamber, and a high frequency coil positioned above the dielectric window at an outside of the processing chamber, the apparatus performing a process on a substrate accommodated in the processing chamber by using inductively coupled plasma generated in the processing chamber by applying a high frequency power to the high frequency coil. The processing gas supply structure includes a single sheet of plate having through holes. Here, the processing gas supply structure may be supported by the upper lid and provided under the dielectric window. Further, a multiple number of groove-shaped gas paths may be formed between the plate and the dielectric window. Furthermore, end portions of the multiple number of groove-shaped gas paths may be opened to edges of the through holes and communicate with the gas inlets. Moreover, the gas supply structure may be configured to supply the processing gas into the processing chamber via the through holes.

In accordance with the present disclosure, it may be possible to provide a plasma processing apparatus and a processing gas supply structure thereof, capable of improving uniformity of a process on a substrate surface in comparison with a conventional apparatus.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Hereinafter, the embodiments of the present disclosure will be described with reference to the accompanying drawings.

Figure 1:
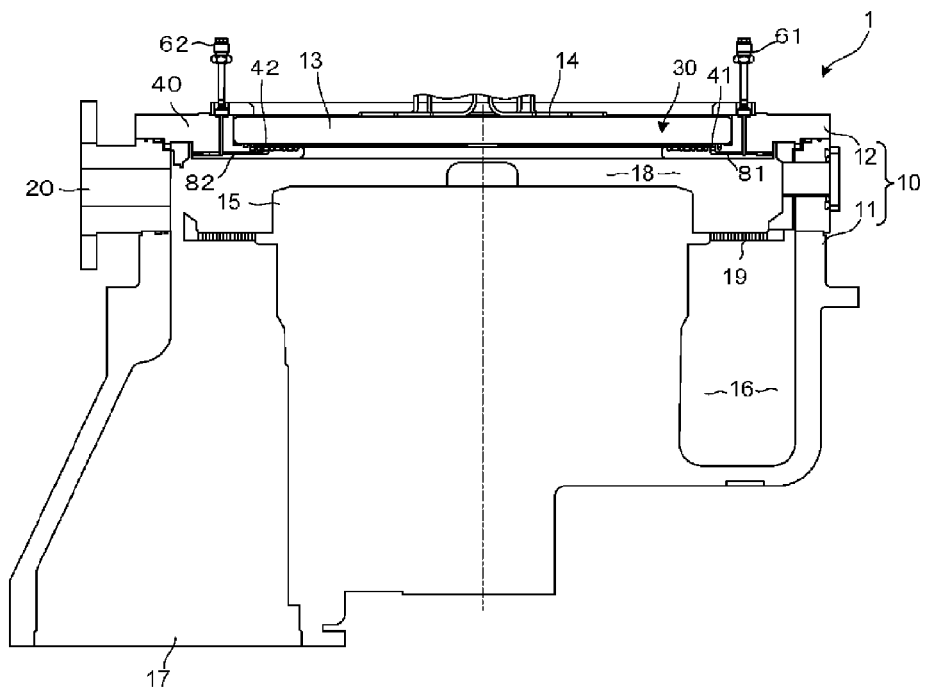
FIG. 1 is a schematic cross sectional view showing a configuration of a plasma etching apparatus in accordance with an embodiment of the present disclosure.

FIG. 1 is a schematic diagram showing a configuration of a plasma etching apparatus 1 as a plasma processing apparatus in accordance with an embodiment of the present disclosure. As shown in FIG. 1, the plasma etching apparatus 1 may include a processing chamber 10. The processing chamber 10 may have a substantially cylindrical shape and be made of, e.g., aluminum whose surface is anodically oxidized. Further, the processing chamber 10 may include a processing chamber main body 11 having a top opening; and an upper lid 12 disposed to cover the top opening of the processing chamber main body 11.

A dielectric window 13 made of, e.g., quartz may be provided in the upper lid 12, and a high frequency coil 14 is positioned so as to be located near an upper portion of the dielectric window 13 at an outside of the processing chamber 10. The high frequency coil 14 may be connected to a non-illustrated high frequency power supply, and a high frequency power having a certain frequency (e.g., about 13.56 MHz) may be supplied thereto.

Within the processing chamber 10, a mounting table 15 for mounting thereon a substrate such as a semiconductor wafer may be provided so as to be located below the dielectric window 13. A non-illustrated electrostatic chuck for attracting and holding the substrate may be provided on a substrate mounting surface of the mounting table 15. Further, a non-illustrated high frequency power supply for applying a bias voltage may be connected to this mounting table 15. An annular gas exhaust space 16 for exhausting a gas downward may be formed around the mounting table 15, and a gas exhaust port 17 communicating with a non-illustrated gas exhaust unit may be formed at the gas exhaust space 16.

A baffle plate 19 may be provided around the mounting table 15 to partition a processing space 18 above the mounting table 15 and the gas exhaust space 16. Further, a loading/unloading port 20 for loading and unloading the substrate to be processed may be formed at a sidewall of the processing chamber main body 11. A non-illustrated opening/closing mechanism such as a gate valve may be provided at the loading/unloading port 20.

Figure 2:
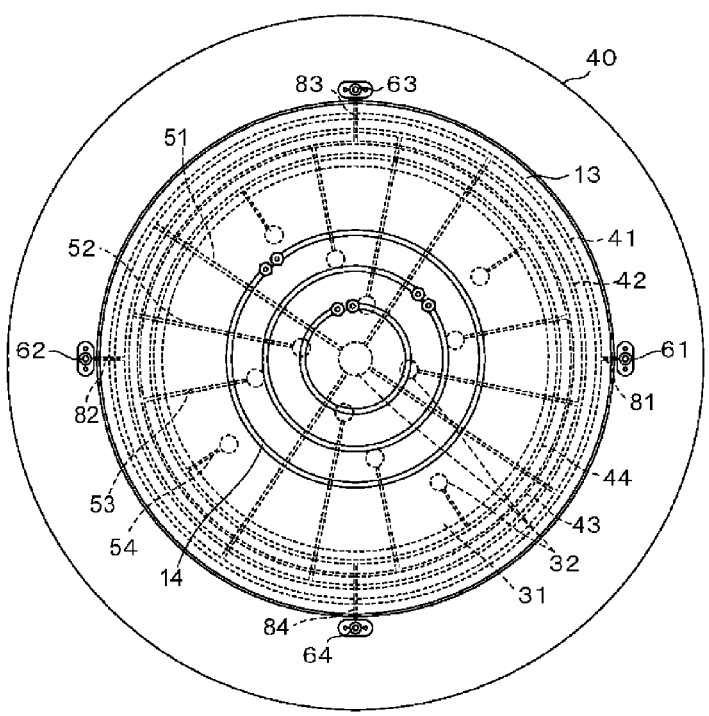
FIG. 2 shows major parts of the plasma etching apparatus of FIG. 1.

Under the dielectric window 13, a processing gas supply device 30 may be provided. The processing gas supply device 30 may include one sheet of plate 31, as shown in enlarged views of FIGS. 3 and 4. As illustrated in FIG. 2, a multiple number of circular through holes 32 are formed in the plate 31. Further, since a through hole 32 is formed in a center of the plate 31, the plate 31 may have an annular shape as a whole.

The plate 31 may be made of a dielectric material such as quartz or ceramic. A thickness of the plate 31 may be equal to or larger than about 3 mm, e.g., about 6 mm. A multiple number of grooves may be formed on a top surface of the plate 31 in a diametrical direction, such that each of the grooves may be extended from an outer peripheral portion of the plate 31 to an edge of each of the through holes 32 formed at an inner peripheral portion of the plate 31. By these grooves, groove-shaped gas paths 51 to 54 may be formed between the dielectric window 13 and the plate 31.

Figure 3:
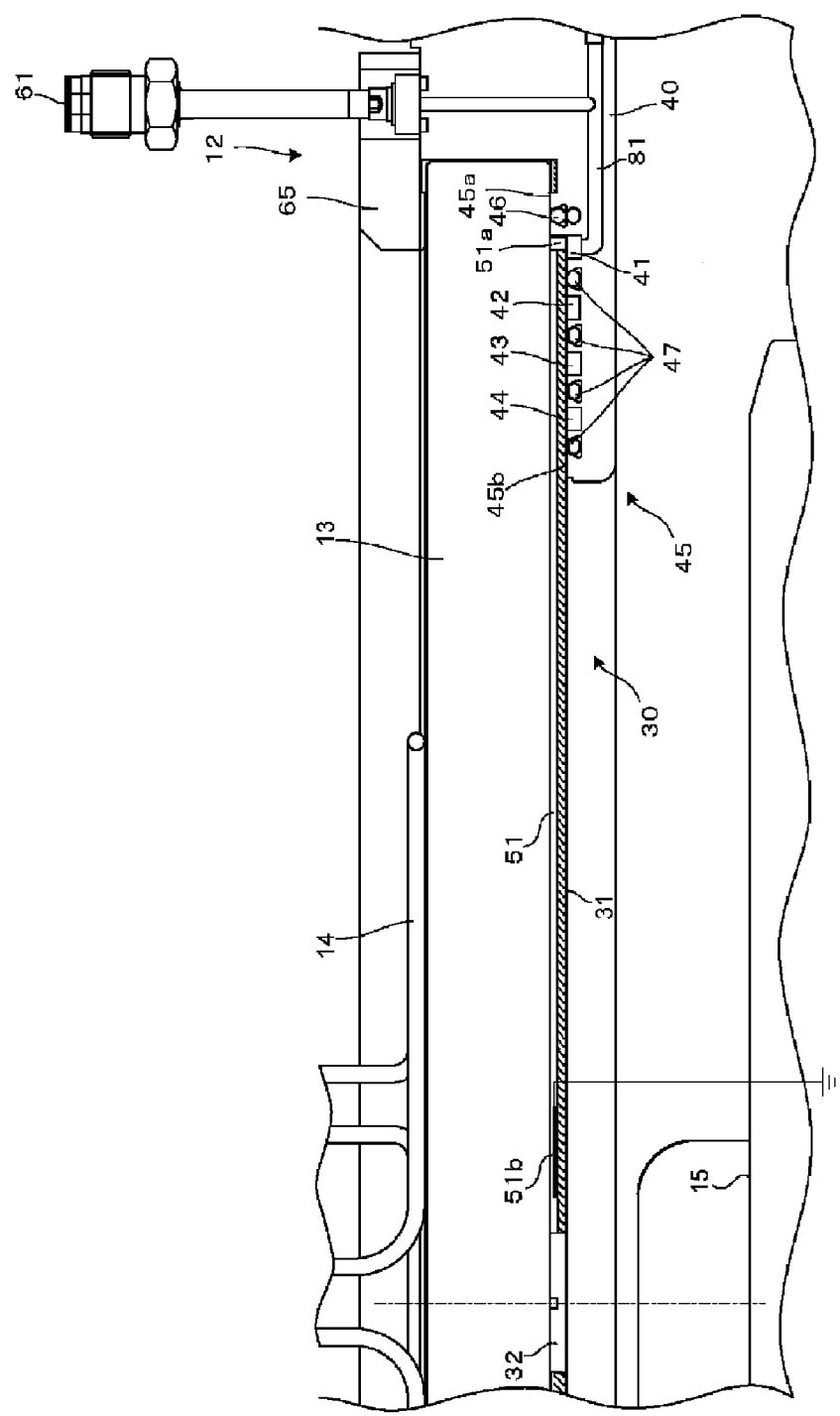
FIG. 3 is a cross sectional view showing major parts of the plasma etching apparatus of FIG. 1.
Figure 4:
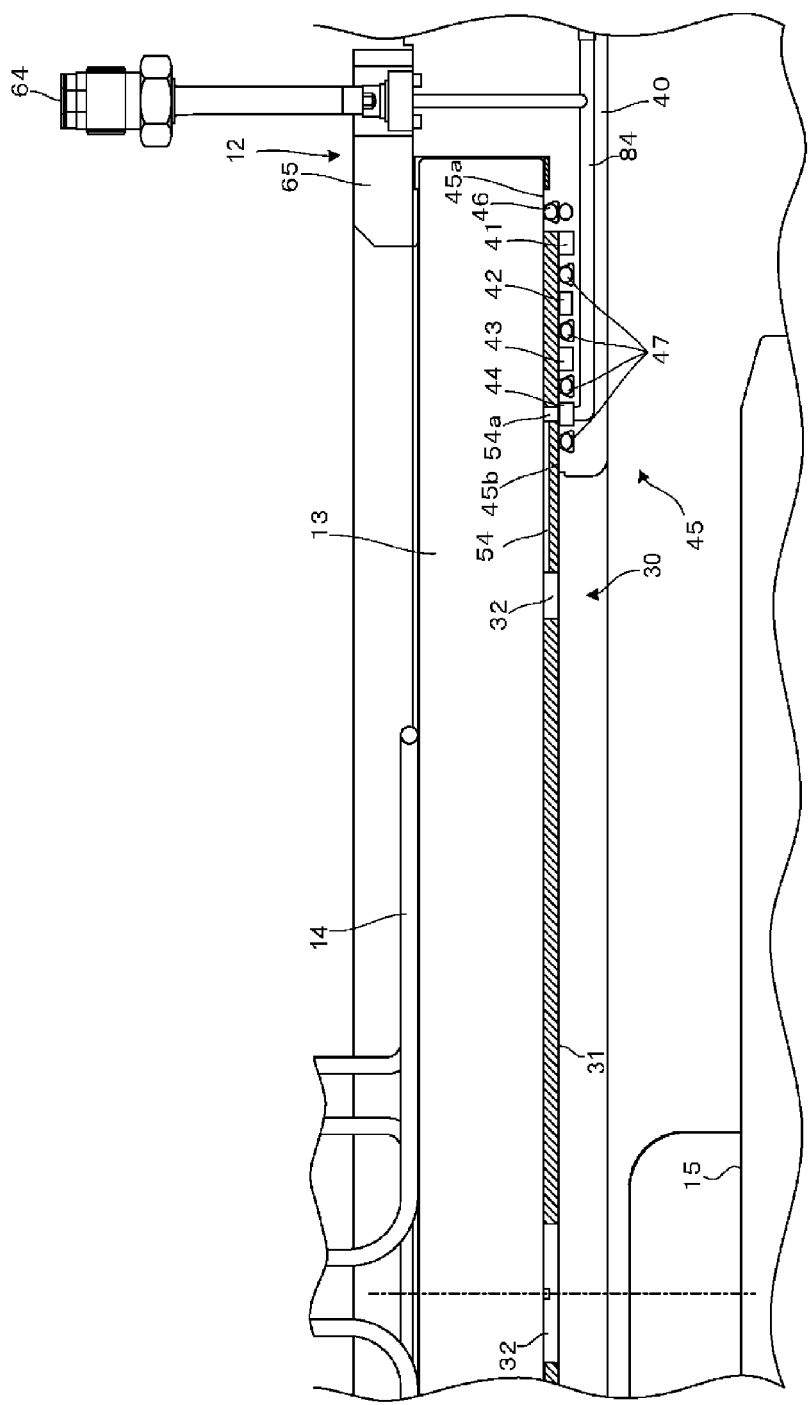
FIG. 4 is a cross sectional view showing major parts of the plasma etching apparatus of FIG. 1.

As shown in FIGS. 3 and 4, an annular member 40 may be provided so as to surround the dielectric window 13 and the plate 31. A protrusion 45 may be installed at a lower inner periphery of the annular member 40 so as to be protruded toward an inner periphery thereof. The protrusion may have a dielectric window supporting portion 45a provided at an outer side thereof and a plate supporting portion 45b provided at an inner side thereof, such that the protrusion 45 has a step shape where the dielectric window supporting portion 45a is higher than the plate supporting portion 45b. Further, the dielectric window supporting portion 45a may support a periphery of a lower surface of the dielectric window 13, while the plate supporting portion 45b may support a periphery of a lower surface of the plate 31. Moreover, an O-ring 46 for airtightly sealing a gap between the dielectric window 13 and the annular member 40 may be provided at the dielectric window supporting portion 45a.

A multiple number of (in the present embodiment, four) annular grooves may be formed on a top surface of the plate supporting portion 45b in contact with the periphery of the lower surface of the plate 31. By making the plate and the plate supporting member 45b come into contact with each other, upper portions of the annular grooves may be airtightly sealed by the plate 31. These annular grooves may serve as annular gas channels 41 to 44. Moreover, O-rings 47 may be provided between the annular gas channels 41 to 44. Further, an O-ring 47 may be also provided at an inner side of the innermost annular gas channel 44.

As shown in FIG. 2, a multiple number of (in the present embodiment, four) gas inlets 61 to 64 may be provided on a top surface of the annular member 40 serving as a part of the upper lid 12. Among these gas inlets 61 to 64, as shown in FIG. 1, the gas inlets 61 and 62 may communicate with the annular gas channels 41 and 42 via processing gas inlet paths 81 and 82 formed in the annular member 40, respectively. Although not shown in FIG. 1, the gas inlets 63 and 64 may communicate with the annular gas channels 43 and 44 via processing gas inlet paths 83 and 84 formed in the annular member 40, respectively.

Moreover, as illustrated in FIG. 3, among the groove-shaped gas paths 51 to 54, an opening 51a may be formed at an outer end of the groove-shaped gas path 51. The groove-shaped gas path 51 may communicate with the annular gas channel 41 via the opening 51a.

In the same manner, as shown in FIG. 4, among the groove-shaped gas paths 51 to 54, an opening 54a may be formed at an outer peripheral end of the groove-shaped gas path 54. The groove-shaped gas path 54 may communicate with the annular gas channel 44 via the opening 54a. In addition, although not shown, the groove-shaped gas paths 52 and 53 may also communicate with the annular gas channels 42 and 43, respectively, in the same manner.

As shown in FIG. 2, the groove-shaped gas paths 51 to 54 may be formed at multiple positions (4 for each and a total of 16 in the example shown in FIG. 2) along a circumference of the plate 31 at a same interval. Further, the groove-shaped gas paths 51 to 54 may be formed so as not to be overlapped with each other along the circumference thereof. In the present embodiment, a length of the groove-shaped gas path 51 communicating with the outermost annular gas channel 41 may be longest and extended to the inner periphery of the plate 31. Further, lengths of the groove-shaped gas paths 52 to 54 may decrease in the order of the groove-shaped gas path 52, the groove-shaped gas path 53 and the groove-shaped gas path 54.

Each of these groove-shaped gas paths 51 to 54 may be formed so as to be perpendicular to the high frequency coil 14 having an annular shape. Accordingly, it may be possible to prevent an electric discharge due to an electromagnetic field generated by the high frequency coil 14 from occurring in the groove-shaped gas paths 51 to 54. Further, the grooves serving as these groove-shaped gas paths 51 to 54 may have a depth of, e.g., about 1 mm to 2 mm.

After the plate 31 is mounted on the plate supporting portion 45b, the dielectric window 13 is mounted on the dielectric window supporting portion 45a so as to be disposed on the plate 31. Then, an annular pressing member 65 provided at the dielectric window 13 may be fixed to the annular member 40 by a bolt. Thereafter, a periphery of the dielectric window 13 may be pressed downward, thereby fixing the plate 31 and the dielectric window 13.

In the processing gas supply device 30 configured as described above, a processing gas introduced from the processing gas inlets 61 to 64 may be supplied into the processing chamber 10 via the through holes 32 communicating with the groove-shaped gas paths 51 to 54 via the processing gas inlet paths 81 to 84, the annular gas channels 41 to 44 and the groove-shaped gas paths 51 to 54.

In this processing gas supply device 30, since no gas diffusion space is provided next to the high frequency coil 14, it may be possible to prevent an electric discharge from occurring in the gas diffusion space. Moreover, regions for discharging the processing gas may not be limited to the central portion and the peripheral portion of the substrate, but can be provided to positions corresponding to a multiple number of certain positions of the substrate in a diametrical direction. Therefore, it may be possible to uniformly supply the processing gas into the processing space 18 above the substrate. As a result, it may be possible to improve uniformity of a process on a substrate surface. Alternatively, by non-uniformly supplying the processing gas into the processing space 18, it may be possible to control a plasma process as a desired.

Further, in the processing gas supply device 30, only a single sheet of plate 31 having a substantially thin thickness may be used as a member provided between the dielectric window 13 and the substrate. Accordingly, by setting a gap between the dielectric window 13 (plate 31) and the substrate on the mounting table 15 to be narrow (e.g., about 10 mm to 40 mm), it may be possible to reduce a height of the processing space 18. As a result, it may be possible to appropriately perform the process on the substrate with a narrow gap between the high frequency coil 14 and the substrate.

That is, as described above, since the single sheet of plate 31 having a substantially thin thickness is used as the member provided between the dielectric window 13 and the substrate, it may be possible to easily reduce the distance between the high frequency coil 14 and the substrate. Moreover, in the processing gas supply device 30, positions for supplying the processing gas into the processing chamber 10 may have the same height, and thus, the processing gas may be supplied from the same positions. Accordingly, even when the process is performed on the substrate with the narrow gap, it may be possible to improve the uniformity of the process on the substrate surface. Further, only the plate 31 having a substantially plane surface without irregularities may be used as the member provided between the dielectric window 13 and the substrate. Accordingly, it may be possible to have the constant distance between the substrate and the plate 31 over the entire substrate surface. Therefore, even when the process is performed on the substrate with the narrow gap, it may be possible to improve the uniformity of the process on the substrate surface.

As described above, the groove-shaped gas paths 51 to may be formed so as to be perpendicular to the high frequency coil 14, and the electric discharge in the groove-shaped gas paths 51 to 54 may not be easily generated. However, in order to surely prevent the electric discharge from occurring in the groove-shaped gas paths 51 to 54, a metal thin film 51b may be formed on a part of each of the groove-shaped gas paths 51 to 54, and the metal thin film 51b may be set to have a ground potential or a different potential.

When a plasma etching process is performed on a semiconductor wafer (substrate) by the plasma etching apparatus 1 configured as described above, the substrate may be loaded into the processing chamber 10 through the loading/unloading port 20 after the non-illustrated opening/closing mechanism opens the loading/unloading port 20. Then, the substrate may be mounted on the mounting table 15, and may be attracted to and held on the electrostatic chuck.

Thereafter, the non-illustrated opening/closing mechanism closes the loading/unloading port 20, and then, the inside of the processing chamber 10 may be evacuated to a certain vacuum level through the gas exhaust port 17 by a non-illustrated vacuum pump.

Then, a processing gas (etching gas) may be supplied into the processing chamber 10 at a certain flow rate by the processing gas supply device 30. Here, the processing gas introduced from the processing gas inlets 61 to 64 may be supplied into the processing chamber 10 via the through holes 32 communicating with the groove-shaped gas paths 51 to 54 via the processing gas inlet paths 81 to 84, the annular gas channels 41 to 44 and the groove-shaped gas paths 51 to 54.

Subsequently, after the inside of the processing chamber 10 is maintained at a certain pressure, a high frequency power having a certain frequency may be applied to the high frequency coil 14. Accordingly, in the processing space 18 above the substrate within the processing chamber 10, ICP (Inductively Coupled plasma) of the etching gas may be generated. Further, when necessary, a high frequency bias power may be applied from a non-illustrated high frequency power supply to the mounting table 15. Accordingly, an etching process can be performed on the substrate by using the ICP.

At this time, since the processing gas is supplied from a multiple number of positions having the same height within the processing chamber 10 by the processing gas supply device 30, it may be possible to uniformly supply the processing gas to the substrate. Further, the processing gas supply device 30 may include the single sheet of plate 31 made of the dielectric material, and may be formed as a single body with the dielectric window 13. Accordingly, since an electromagnetic field induced into the processing space via the dielectric window 13 is blocked, it may be possible to uniformly perform the process on the substrate. As a result, a plasma state can be uniformized, so that an etching process can be uniformly performed on each portion of the substrate. That is, it may be possible to improve uniformity of the process on the substrate surface.

Upon the completion of the plasma etching process, the application of the high frequency power and the supply of the processing gas may be stopped, and the substrate may be unloaded from the processing chamber 10 in the order reverse to that described above.

Moreover, the present disclosure is not limited to the above-described embodiments but can be modified in various ways. By way of example, the number of the annular gas channels 41 to 44 and the number of the groove-shaped gas paths 51 to 54 of the processing gas supply device 30 may be not limited to those described above, but can be varied.

What is claimed is:
1. A plasma processing apparatus for performing a process on a substrate accommodated in a processing chamber by generating inductively coupled plasma in the processing chamber, the apparatus comprising:

an upper lid, provided to cover a top opening of the processing chamber, having a dielectric window;
a plurality of gas inlets provided at the upper lid, for supplying a processing gas into the processing chamber;
a high frequency coil positioned above the dielectric window at an outside of the processing chamber;
a gas supply device including a single sheet of plate having through holes, the gas supply device being supported by the upper lid and provided under the dielectric window; and
an annular member, provided so as to surround the dielectric window and the plate and in contact with a periphery of a lower surface of the plate, configured to form a plurality of annular gas channels between the plate and the annular member,
wherein a plurality of linear groove-shaped gas paths are formed between the plate and the dielectric window,
end portions of the plurality of the linear groove-shaped gas paths are opened to edges of the through holes and communicate with the gas inlets,
the gas supply device is configured to supply the processing gas into the processing chamber via the through holes, and
the gas inlets and the plurality of the linear groove-shaped gas paths communicate with each other through the annular gas channels.

2. The plasma processing apparatus of claim 1, wherein the plate is made of a dielectric material.

3. The plasma processing apparatus of claim 2, wherein the plate is made of quartz or ceramic.

4. The plasma processing apparatus of claim 1, wherein the plate has an annular shape.

5. The plasma processing apparatus of claim 1, wherein the linear groove-shaped gas paths are formed so as to be perpendicular to the high frequency coil.

6. The plasma processing apparatus of claim 1, wherein a metal thin film is formed at a portion of the linear groove-shaped gas paths.

7. A plasma processing apparatus of claim 1, wherein a distance between the plate and the substrate within the processing chamber ranges from about 10 mm to about 40 mm.

8. A processing gas supply structure of a plasma processing apparatus including an upper lid provided to cover a top opening of the processing chamber and having a dielectric window, a plurality of gas inlets provided at the upper lid and configured to supply a processing gas into the processing chamber, a high frequency coil positioned above the dielectric window at an outside of the processing chamber, and an annular member configured to form a plurality of annular gas channels, the apparatus performing a process on a substrate accommodated in the processing chamber by using inductively coupled plasma generated in the processing chamber by applying a high frequency power to the high frequency coil, the processing gas supply structure comprising:
a single sheet of plate having through holes,
wherein the processing gas supply structure is supported by the upper lid and provided under the dielectric window,
a plurality of linear groove-shaped gas paths are formed between the plate and the dielectric window,
end portions of the plurality of the linear groove-shaped gas paths are opened to edges of the through holes and communicate with the gas inlets,
the gas supply structure is configured to supply the processing gas into the processing chamber via the through holes,
the annular member is in contact with a periphery of a lower surface of the plate,
the plurality of annular gas channels are formed between the plate and the annular member, and
the gas inlets and the plurality of the linear groove-shaped gas paths communicate with each other through the annular gas channels.

9. A plasma processing apparatus comprising:
a processing chamber configured to perform a plasma process on a substrate by generating inductively coupled plasma therein;
an upper lid, provided to cover a top opening of the processing chamber;
a mounting table for mounting thereon the substrate; and
a gas exhaust port communicating with a gas exhaust unit configured to exhaust a processing gas within the processing chamber,
wherein the upper lid comprises:
a dielectric window;
an annular member provided so as to surround the dielectric window and supporting the dielectric window;
a high frequency coil positioned above the dielectric window at an outside of the processing chamber;
a gas supply device configured do supply the processing gas into the processing chamber; and
a plurality of gas inlets provided in the annular member,
wherein the gas supply device comprises:
a plate supported by the upper lid and having through holes, wherein the annular member surrounds the plate;
a plurality of linear groove-shaped gas paths formed between the plate and the dielectric window;
a plurality of processing gas inlet paths provided in the annular member and communicating with the gas inlets and the linear groove-shaped gas paths; and
a plurality of annular gas channels communicating with the processing gas inlet paths and the gas inlets.

10. The plasma processing apparatus of claim 9, wherein the plate has an annular shape.

11. The plasma processing apparatus of claim 9, wherein the linear groove-shaped gas paths are formed so as to be perpendicular to the high frequency coil.

12. The plasma processing apparatus of claim 9, wherein a metal thin film is formed at a portion of the linear groove-shaped gas paths.

13. The plasma processing apparatus of claim 9, wherein a distance between the plate and the substrate within the processing chamber ranges from about 10 mm to about 40 mm.

* * * * *

UNITED STATES PATENT AND TRADEMARK OFFICE
CERTIFICATE OF CORRECTION

PATENT NO.           : 9,117,633 B2
APPLICATION NO.      : 13/271399
DATED                : August 25, 2015
INVENTOR(S)          : Hachishiro Iizuka It is certified that error appears in the above-identified patent and that said Letters Patent is hereby corrected as shown below:

In the specification,

Column 4, line 3, please add -- 45 -- between "protrusion" and "may"

Column 4, line 19, please add -- 31 -- between "plate" and "and the"

Column 5, line 64, please add -- 54 -- between "51 to" and "may"

Signed and Sealed this
Fifth Day of July, 2016

Michelle K. Lee
*Director of the United States Patent and Trademark Office*